(12) United States Patent
Yamazaki et al.

(10) Patent No.: US 7,816,755 B2
(45) Date of Patent: Oct. 19, 2010

(54) PHOTOELECTRIC CONVERSION DEVICE WITH ISOLATION ARRANGEMENT THAT REDUCES PIXEL SPACE WITHOUT REDUCING RESOLUTION OR SENSITIVITY

(75) Inventors: Kazuo Yamazaki, Ebina (JP); Tetsunobu Kochi, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 150 days.

(21) Appl. No.: 12/185,267

(22) Filed: Aug. 4, 2008

(65) Prior Publication Data

US 2009/0050993 A1    Feb. 26, 2009

(30) Foreign Application Priority Data

Aug. 24, 2007   (JP)   ............... 2007-218330

(51) Int. Cl.
  H01L 31/06   (2006.01)
  H01L 31/00   (2006.01)
  H01L 31/062  (2006.01)
  H01L 31/113  (2006.01)

(52) U.S. Cl. ............... 257/462; 257/292; 257/293; 257/439; 257/461; 257/463; 257/464; 257/465; 257/E31.052; 257/E31.053; 257/E31.063; 257/E31.069; 257/E31.071; 257/E31.073; 257/E31.076; 257/E31.079; 257/E31.082; 257/E31.096; 257/E31.104; 257/E31.115; 257/E33.076

(58) Field of Classification Search ......... 257/292–293, 257/439, 461–463, E31.052, E31.053, E31.063, 257/E31.069, E31.071, E31.073, E31.076, 257/E31.079, E31.082, E31.096, E31.104, 257/E31.115, E33.076, 464–465

See application file for complete search history.

(56) References Cited

U.S. PATENT DOCUMENTS

| | | | | |
|---|---|---|---|---|
| 5,563,429 A | * | 10/1996 | Isogai | 257/258 |
| 5,847,381 A | * | 12/1998 | Isogai | 250/208.1 |
| 6,091,793 A | * | 7/2000 | Kamashita | 377/60 |
| 6,188,094 B1 | | 2/2001 | Kochi et al. | 257/232 |
| 6,403,998 B1 | * | 6/2002 | Inoue | 257/292 |
| 6,717,151 B2 | | 4/2004 | Tashiro et al. | 250/370.11 |
| 7,015,521 B2 | * | 3/2006 | Koyama | 257/292 |
| 7,016,089 B2 | | 3/2006 | Yoneda et al. | 358/482 |
| 7,023,035 B2 | * | 4/2006 | Lai | 257/292 |
| 7,084,443 B2 | * | 8/2006 | Kitano et al. | 257/291 |
| 7,110,030 B1 | | 9/2006 | Kochi et al. | 348/308 |
| 7,259,412 B2 | * | 8/2007 | Yamaguchi et al. | 257/291 |
| 7,294,873 B2 | * | 11/2007 | Suzuki et al. | 257/225 |

(Continued)

FOREIGN PATENT DOCUMENTS

JP        2007-027558 A    2/2007

*Primary Examiner*—Ida M Soward
(74) *Attorney, Agent, or Firm*—Fitzpatrick, Cella, Harper & Scinto

(57) ABSTRACT

A pixel space is narrowed without increasing PN junction capacitance. A photoelectric conversion device includes a plurality of pixels arranged therein, each including a first impurity region of a first conductivity type forming a photoelectric conversion region, a second impurity region of a second conductivity type forming a signal acquisition region arranged in the first impurity region, a third impurity region of the first conductivity type and a fourth impurity region of the first conductivity type are arranged in a periphery of each pixel for isolating the each pixel, the fourth impurity region is disposed between adjacent pixels, and an impurity concentration of the fourth impurity region is smaller than an impurity concentration of the third impurity region.

21 Claims, 9 Drawing Sheets

U.S. PATENT DOCUMENTS

| | | | |
|---|---|---|---|
| 7,352,028 B2 * | 4/2008 | Kuwazawa | 257/323 |
| 7,372,089 B2 * | 5/2008 | Inoue et al. | 257/292 |
| 7,511,324 B2 * | 3/2009 | Unagami et al. | 257/294 |
| 7,535,073 B2 * | 5/2009 | Ezaki | 257/440 |
| 7,592,575 B2 | 9/2009 | Kochi | 250/208.1 |
| 7,709,870 B2 * | 5/2010 | Inoue et al. | 257/292 |
| 2005/0104100 A1 * | 5/2005 | Ishida et al. | 257/292 |
| 2006/0170009 A1 * | 8/2006 | Kitano et al. | 257/236 |
| 2006/0226438 A1 * | 10/2006 | Katsuno et al. | 257/113 |
| 2008/0006892 A1 * | 1/2008 | Ura et al. | 257/431 |

* cited by examiner

PHOTOELECTRIC CONVERSION DEVICE WITH ISOLATION ARRANGEMENT THAT REDUCES PIXEL SPACE WITHOUT REDUCING RESOLUTION OR SENSITIVITY

BACKGROUND OF THE INVENTION

1. Field of the Invention

The present invention relates to a photoelectric conversion device and a multi-chip image sensor, and in particular, to a photoelectric conversion device and a multi-chip image sensor which are used for a scanner, a video camera, a digital still camera, and the like.

2. Description of the Related Art

Heretofore, in a photoelectric conversion device of a linear type used for reading of a scanner and a fax for pixel reading, adjacent pixels were isolated by isolating a semiconductor region with a buried region of a first conductivity type, and a barrier region of the first conductivity type. Each pixel has a photodiode made of a PN junction of a first conductivity type region made of an epitaxial layer, and a second conductivity type region formed in the first conductivity type region. Such structure is disclosed in Japanese Patent Application Laid-Open No. 2007-027558.

SUMMARY OF THE INVENTION

A photoelectric conversion device of the present invention is a photoelectric conversion device including a plurality of pixels arranged therein, each including a first impurity region of a first conductivity type forming a photoelectric conversion region, a second impurity region of a second conductivity type forming a signal acquisition region arranged in the first impurity region, being characterized in that a third impurity region of the first conductivity type and a fourth impurity region of the first conductivity type are arranged in adjacent to the first impurity region, that the fourth impurity region is disposed between the second impurity region and a second impurity region of an adjacent pixel, and that an impurity concentration of the fourth impurity region is smaller than an impurity concentration of the third impurity region.

In addition, the photoelectric conversion device of the present invention is a photoelectric conversion device including a plurality of pixels arranged therein, each including a first impurity region of a first conductivity type forming a photoelectric conversion region, and a second impurity region of a second conductivity type forming a signal acquisition region arranged in the first impurity region, being characterized in that a third impurity region of the first conductivity type and a fourth impurity region of the first conductivity type are arranged in adjacent to of the first impurity region, that the fourth impurity region is disposed between the second impurity region and a second impurity region in an adjacent pixel, and that an isolation width of the fourth impurity region is narrower than an isolation width of the third impurity region.

Furthermore, the photoelectric conversion device of the present invention is a photoelectric conversion device including a plurality of pixels arranged therein, each including a first impurity region of a first conductivity type forming a photoelectric conversion region, and a second impurity region of a second conductivity type forming a signal acquisition region arranged in the first impurity region, being characterized in that a third impurity region of the first conductivity type and a fourth impurity region of the first conductivity type are arranged in adjacent to the first impurity region, that the fourth impurity region is disposed between the second impurity region and a second impurity region of an adjacent pixel, and that a depth of the fourth impurity region is smaller than a depth of the third impurity region.

Other features and advantages of the present invention will be apparent from the following description taken in conjunction with the accompanying drawings, in which like reference characters designate the same or similar parts throughout the figures thereof. The accompanying drawings, which are incorporated in and constitute a part of the specification, illustrate embodiments of the invention and, together with the description, serve to explain the principles of the invention.

DESCRIPTION OF THE EMBODIMENTS

Hereafter, the present invention will be described in detail with using drawings.

Figure 12:
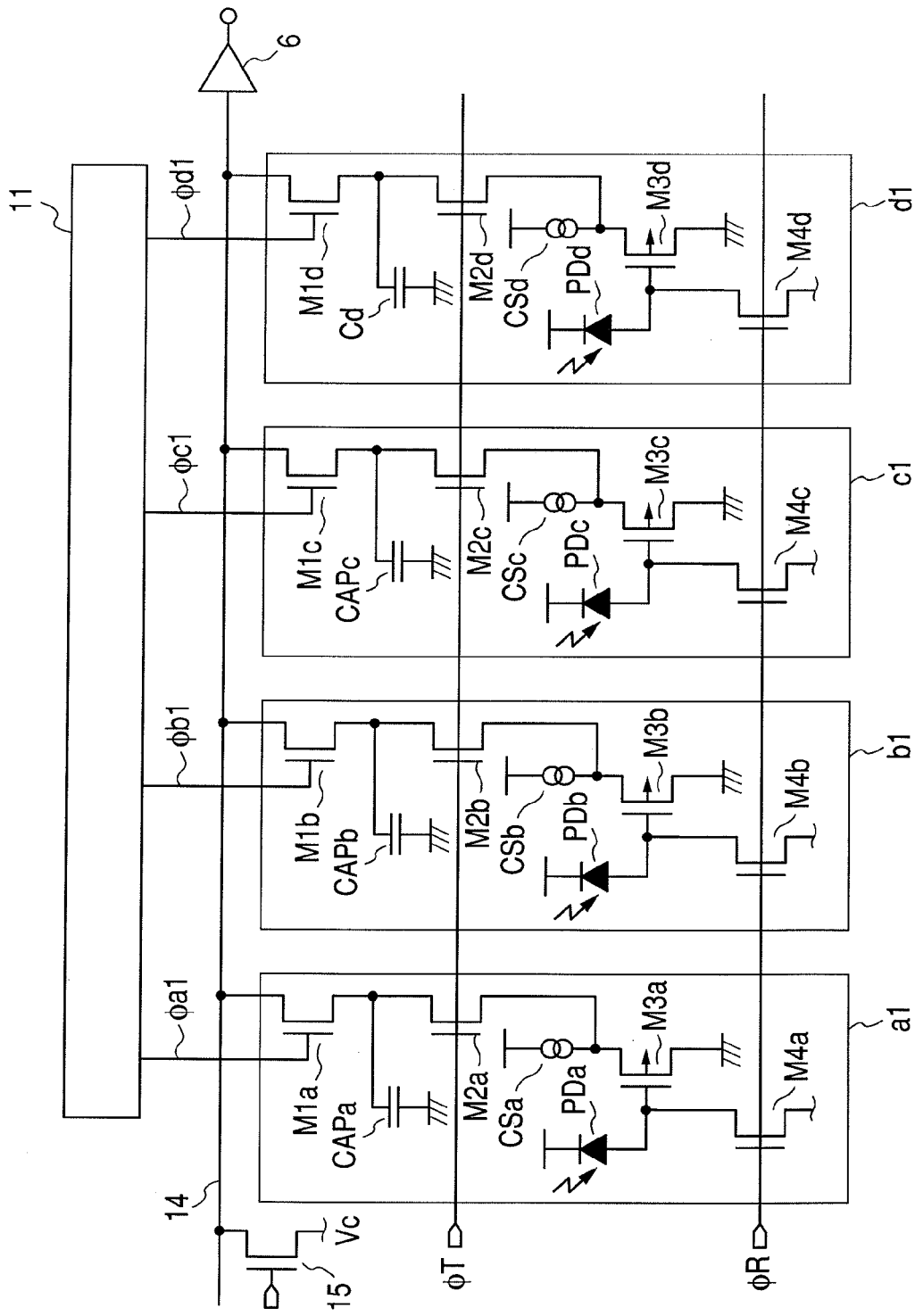
FIG. 12 is a circuit diagram showing an example of a photoelectric conversion device.

First, an example of a circuit of a photoelectric conversion device will be described using FIG. 12. FIG. 12 is an equivalent circuit of photoelectric conversion sections and driving circuits of four pixels. Pixels a1 to d1 include photodiodes PDa to PDd which are photoelectric conversion sections. Furthermore, the pixels a1 to d1 have amplifying transistors M3a to M3d which construct source follower circuits, and reset transistors M4a to M4d which are units to reset the photodiodes PDa to PDd. Signals output from the amplifying transistors M3a to M3d are temporarily held through read transistors M2a to M2d in accumulation regions CAPa to CAPd, and are output to a common signal line 14 through the read transistors M1a to M1d. Let a circuit from the amplifying transistors to the common signal line be a readout circuit.

Electric charges generated by photoelectric conversion in the photodiodes PDa to PDd are given charge-voltage conversion through the amplifying transistors M3a to M3d. Then, the signals based on the electric charges are transferred to the accumulation regions CAPa to CAPd by a signal transfer pulse ΦT in a lump. Constant current loads CSa to CSd of the source follower circuits are shown. Then, the read transistors M1a to M1d are turned on sequentially by the read pulses Φa1 to Φd1 which are supplied from a scan circuit 11 and become high one by one, and a signal is read from a signal output amplifier 6 through the common signal line 14.

First Embodiment

Figure 1:
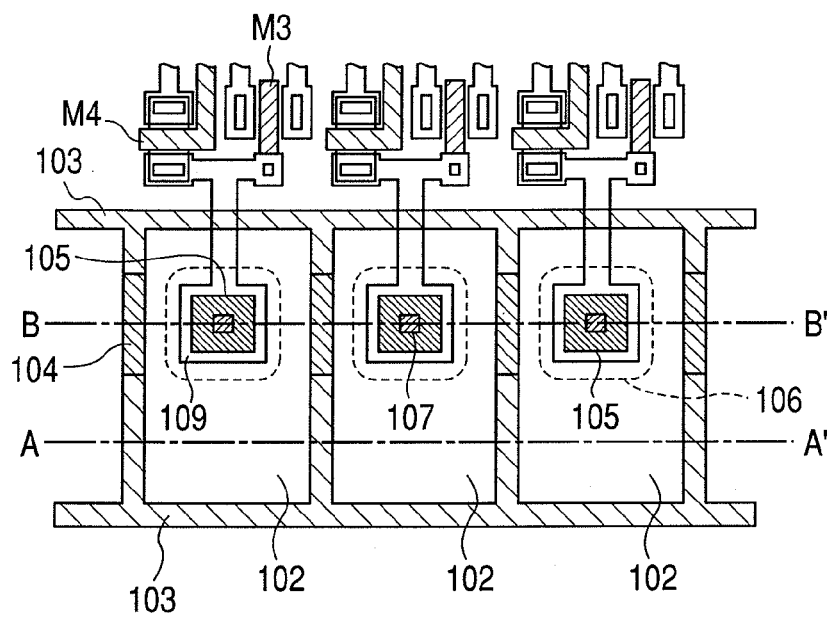
FIG. 1 is a plan showing structure of a first embodiment including three pixels.
Figure 2A:
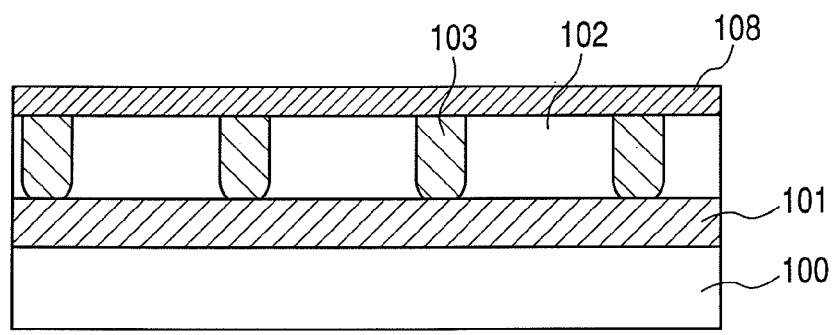
FIG. 2A is a schematic diagram of section structure of an A-A' section in FIG. 1.
Figure 2B:
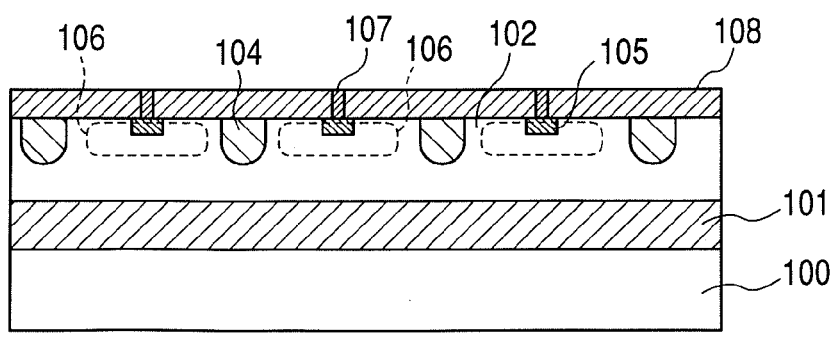
FIG. 2B is a schematic diagram of section structure of a B-B' section in FIG. 1.

FIG. 1 is a plan showing structure of including three pixels in a first embodiment. FIG. 1 shows the photoelectric conversion section shown in FIG. 12 with focusing it. FIG. 2A is a schematic diagram of section structure in an A-A' section in FIG. 1, FIG. 2B is a schematic diagram of section structure in a B-B' section in FIG. 1. In addition, in FIGS. 1, 2A and 2B, the same reference characters are assigned to the same components.

In FIGS. 1, 2A and 2B, a semiconductor substrate 100 is shown. By this embodiment, a case of an N-type semiconductor substrate will be described as an example. An N-type buried diffusion region 101, and an N-type epitaxial region (a first impurity region) 102 formed on the semiconductor substrate 100 are shown. In addition, a first N-type element isolation region (a third impurity region) 103, a second N-type element isolation region (a fourth impurity region) 104, and a P-type region (a second impurity region) 105, which is a signal acquisition region are shown. The epitaxial region 102 and electric charge acquisition region 105 form a PN junction, and construct a photoelectric conversion section. Here, let a minimum repeating unit including one photoelectric conversion section be a pixel. Two or more pixels are arranged in a semiconductor substrate.

The first N-type element isolation region 103 and the second N-type element isolation region 104 are provided at a periphery of the epitaxial region 102 of an N-type of each pixel, and isolate both of the N-type epitaxial regions 102 of respective pixels electrically. For example, the first N-type element isolation region 103 is arranged between the photoelectric conversion section and readout circuit. The second N-type element isolation region 104 is arranged between with an adjacent P-type region 105. The P-type region 105 is connected through a metal electrode 107 and a wiring 109 to a readout circuit. In addition, a region 106 surrounded by dotted lines denotes a depletion layer region of a PN junction.

In FIGS. 2A and 2B which are sectional views, an interlayer insulation film 108 formed on the N-type epitaxial region 102 is shown.

As shown in FIG. 1, a photodetector section of each pixel is superficially surrounded by a first N-type element isolation region 103 and a second N-type element isolation region 104. Wherein, the superficially surrounded is a configuration in a view along a plane including a right receiving surface of a light receiving portion of each structure. Furthermore, in a depth direction, as shown in FIG. 2A, the photodetector section of each pixel is surrounded in an N-type buried region 101 and a first N-type element isolation region 103. Photo carriers (here, holes) generated by photoelectric conversion according to light incident into an N-type epitaxial region 102 are collected into a P-type region 105, and are read into a readout circuit through a metal electrode 107. Here, structure and operations of the wiring 109 and readout circuit are omitted. Also, an electric charge generated in the element isolation regions 103 and 104 is also collected into the P-type region 105.

The generated photo carriers are collected together in the P-type region 105 by diffusion when being out of a depletion layer 106, or are collected together in the P-type region 105 by drift when being within the depletion layer 106.

The N-type epitaxial region 102 is formed so that an impurity concentration may become lower than those of the first N-type element isolation region 103, second N-type element isolation region 104, and N-type buried region 101. Therefore, there arise potential differences between the N-type epitaxial region 102, and the first N-type element isolation region 103, second N-type element isolation region 104, and N-type buried region 101. These potential differences act so as to reduce traffic of photo carriers between pixels, that is, crosstalk. In addition, the potential differences reduce wash away of the photo carriers to the N-type semiconductor substrate 100, and act so as to suppress degrading sensitivity.

Here, subjects will be described. When a disposing pitch of a pixel which has an element isolation region became narrow, there was a case that a space between the element isolation region of an N-type and a P-type region became narrow, and a PN junction capacity of a photodiode, that is, detecting capacitance Cpd became large. Here, photo carriers collected together in the P-type region 105 are given electric charge-voltage conversion by the detecting capacitance Cpd including capacitance of the PN junction of the P-type region 105 and the epitaxial region 102 of the N-type. Let an output voltage be V and let an amount of photo carriers be Q, and as to a formula of this electric charge-voltage conversion, the output voltage V is expressed as follows:

$$V = Q/Cpd$$

Hence, when the photo carriers collected are the same, the larger the detecting capacitance Cpd is, the more sensitivity is degraded. On the contrary, the smaller the detecting capacitance Cpd is, the larger the output voltage V becomes, and it is possible to form a photoelectric conversion device with high sensitivity. Therefore, in order to achieve the photoelectric conversion device which can obtain a good image with high sensitivity using pixels of this construction, it is important to make this detecting capacitance Cpd small.

Capacity Cj of the PN junction between the P-type region 105 and N-type epitaxial region 102 which form a part of the detecting capacitance is as follows (capacitance/unit junction area):

$$Cj = \frac{\varepsilon_S}{W} = \sqrt{\frac{q\varepsilon_S N_B}{2(V_{bi} - V)}} \quad \text{Formula (1)}$$

where $\varepsilon_s$ denotes a dielectric constant of Si, and W does a depletion layer width.

In addition, Vbi denotes a built-in electric potential, V does an applied voltage, q does elementary charge, and $N_B$ does an impurity concentration of the N-type epitaxial region 102 in this example.

Hence, it is possible to make the junction capacitance of the PN junction small by making the impurity concentration of the N-type epitaxial region 102 low.

Here, when the pixel pitch becomes narrow gradually, an element isolation region approaches the P-type region to affect the PN junction, or forms a PN junction. In such a case, a concentration of $N_B$ in Formula (1) becomes higher than that of the epitaxial region, or is replaced by a high impurity concentration of the element isolation region. Hence, since the capacitance Cj of the PN junction becomes large and the output voltage V becomes small, sensitivity degrades. So, in this embodiment, a second N-type element isolation region 104 whose impurity concentration is higher than that of the N-type epitaxial region 102, but lower than that of the first N-type element isolation region 103 is provided. Sensitivity is enhanced with crosstalk by flow out of the photo carriers being suppressed by this structure.

This uses the previously-described characteristics that photo carriers are collected into the P-type region 105 by diffusion when being out of the depletion layer region 106 or by drift when being within the depletion layer region 106.

Thus, in FIG. 1, the photo carriers generated in the depletion layer region 106 are collected by drift into the P-type region 105. For this reason, if the depletion layer region 106 is widened to near pixel limits, even if a high-concentration potential does not isolate between pixels, required photo carriers can be collected by the drift, and transfer of the photo carriers between adjacent pixels can be also reduced.

In addition, at a periphery of the depletion layer region 106, since an influence which the element isolation region gives to the PN junction capacitance is reduced by forming the second element isolation region 104 whose concentration is lower than that of the first element isolation region 103, it is possible to suppress an increase in the detecting capacitance.

On the other hand, in order to make a potential barrier high so as to fully collect photo carriers generated outside the depletion layer region 106 by diffusion, the first element isolation region 103 isolates a region whose influence to a depletion layer of the depletion layer region 106 is little.

Thus, isolation is performed by selecting and arranging the first N-type element isolation region 103 or the second low-element isolation region 104 whose concentration is lower than that of the first N-type element isolation region 103. By such structure, a pixel space without increasing the PN junction capacitance of the photoelectric conversion section can be narrowed.

Hence, it is possible to achieve the photoelectric conversion device which has such pixel structure that is compatible in reduction of the increase in crosstalk and prevention from degrading sensitivity also in the high resolution pixel pitch.

Here, although being provided in a longer side of a rectangular pixel, the second element isolation region 104 is provided in a shorter side in the case that pixels are adjacent in the shorter side. Thus, the second element isolation region 104 can be put in a portion nearest to a signal readout region between pixels.

Nevertheless, such structure of arranging the second element isolation region 104 between the P-type regions 105 of two adjacent pixels is as shown in FIG. 1 has a particularly advantageous effect at the time of forming a sensor with a narrow pixel pitch. This is because an influence to divergence of the depletion layer is great since a space between the two P-type regions 105 of adjacent pixels is most hard to secure a distance between the element isolation region and P-type region.

FIGS. 3A to 3H, and FIGS. 4A to 4H are process charts for describing a manufacturing process of the pixel structure in FIGS. 1, 2A and 2B. FIGS. 3A to 3H correspond to the A-A' section in FIG. 1, and FIGS. 4A to 4H correspond to the B-B' section in FIG. 1.

Hereafter, manufacturing processes of the photoelectric conversion section of this embodiment will be described every process using drawings. Descriptions of manufacturing processes of a MOSFET and the like which form a readout circuit of this photoelectric conversion device are omitted for simplification.

Figure 3A:
FIGS. 3A, 3B, 3C, 3D, 3E, 3F, 3G and 3H are process charts for showing a semiconductor manufacturing of pixel structure of the first embodiment.
Figure 4A:
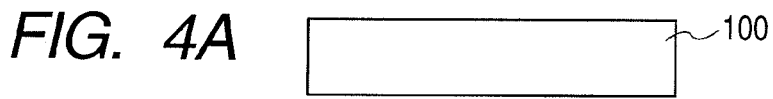
FIGS. 4A, 4B, 4C, 4D, 4E, 4F, 4G and 4H are process charts for showing a semiconductor manufacturing of pixel structure of the first embodiment.

First, as shown in FIG. 3A and FIG. 4A, an N-type semiconductor substrate 100 is prepared.

Figure 3B:
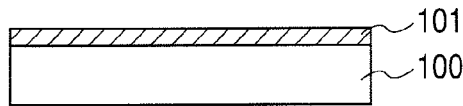
Figure 4B:
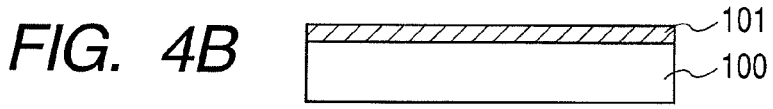

Next, as shown in FIG. 3B and FIG. 4B, the N-type buried region 101 is formed on the N-type semiconductor substrate 100 by an ion implantation process.

Figure 3C:
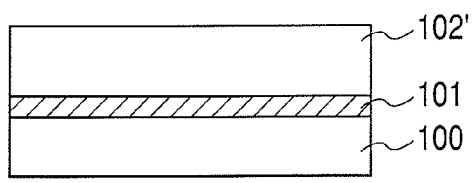
Figure 4C:
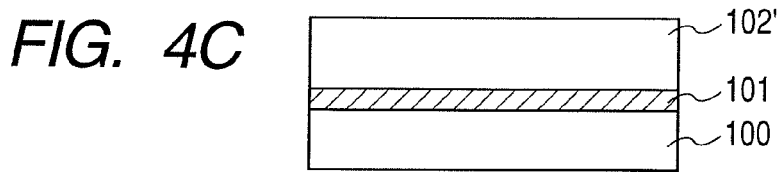

Next, as shown in FIG. 3C and FIG. 4C, the N-type epitaxial region 102' is formed on the N-type buried layer 101 by epitaxial growth.

Figure 3D:
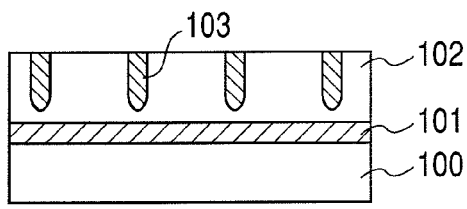
Figure 4D:
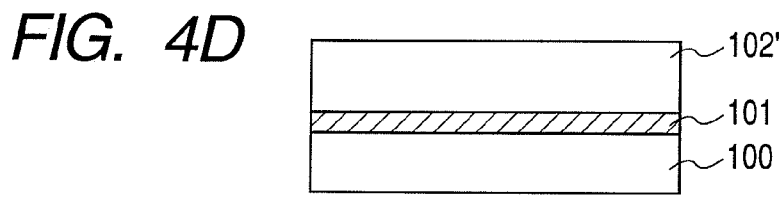

Subsequently, as shown in FIG. 3D and FIG. 4D, the first N-type element isolation region 103 is formed in a region of the N-type epitaxial region 102', specified in a photolithography process, in the ion implantation process.

Figure 3E:
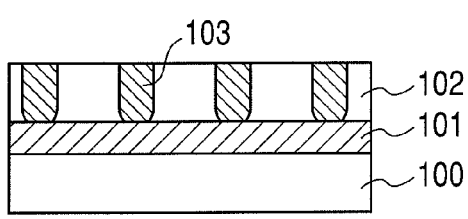
Figure 4E:
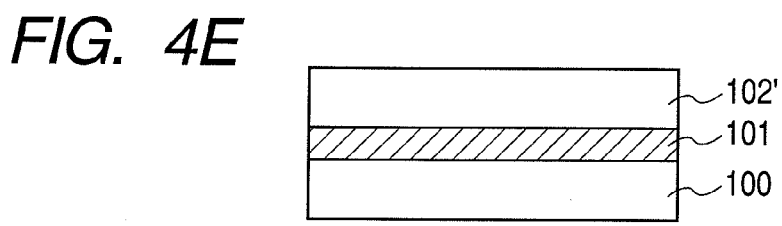

Next, as shown in FIG. 3E and FIG. 4E, the N-type buried region 101 and first N-type element isolation region 103 are diffused by thermal diffusion.

Figure 3F:
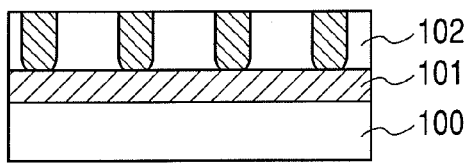
Figure 4F:
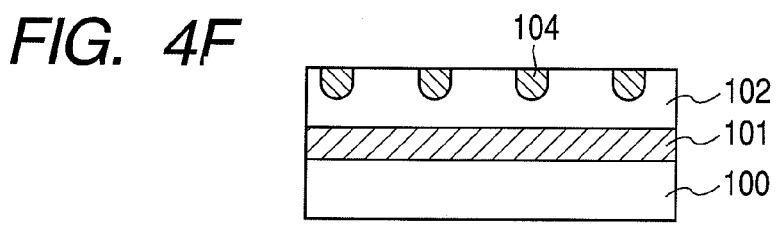

Subsequently, as shown in FIG. 3F and FIG. 4F, the second N-type element isolation region 104 is formed in a region of the N-type epitaxial region 102, specified in the photolithography process, in the ion implantation process.

Here, an impurity concentration of the N-type epitaxial region 101 is about 1e14 to 1e15/cm$^3$, and, an impurity concentrations of the N-type buried layer 102 and first N-type element isolation region 103 are concentrations higher than that of the epitaxial region 1001, and is, for example, a concentration exceeding 1e16 to 1e18/cm$^3$. It is desirable that the N-type epitaxial region 101 and first N-type element isolation region 103 have 10 to 100 times or more of impurity concentration difference so as to form a potential barrier for isolating an element. On the other hand, an impurity concentration of the second N-type element isolation region is made about 1e15 to 1e17/cm$^3$, and its impurity concentration is made lower than that of the first N-type element isolation region. Phosphorus and arsenic are used as impurities.

Figure 3G:
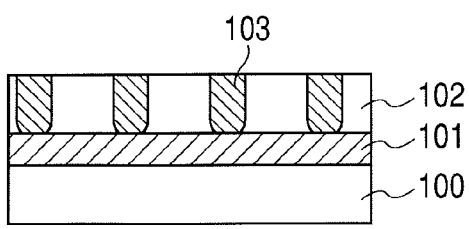
Figure 4G:
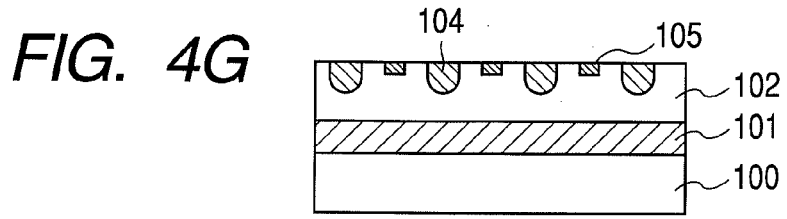

Next, as shown in FIG. 3G and FIG. 4G, the P-type region 105 is formed in a region of the N-type epitaxial region 102, specified in the photolithography process, in the ion implantation process.

Figure 3H:
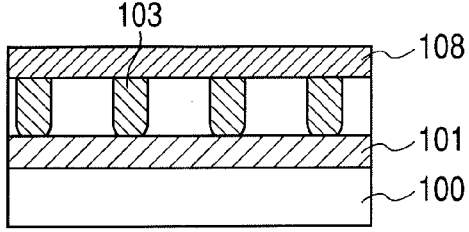
Figure 4H:
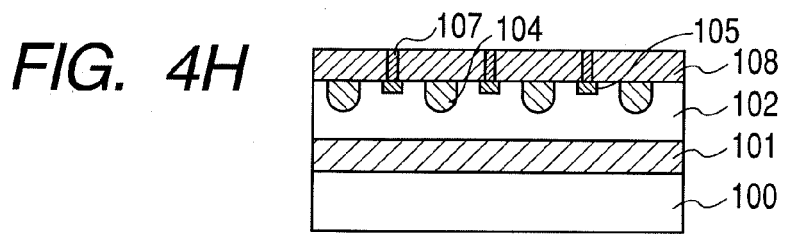

Finally, as shown in FIG. 3H and FIG. 4H, an interlayer insulation film 108 and the metal electrode 107 are formed.

When being formed in the thermal diffusion process described in FIG. 3E and FIG. 4E, the first N-type element isolation region 103 is spread not only in a depth direction but also in a lateral direction, and hence, as described above, the distance between the first N-type element isolation region 103 and P-type region 105 becomes short easily, and hence, degrading sensitivity by the increase in detecting capacitance particularly poses a problem easily in this manufacturing process.

For example, when an impurity concentration of the first N-type element isolation region is 1e18/cm$^3$ ($1\times10^{18}$/cm$^3$) and an impurity concentration of the epitaxial region is 1e14/cm$^3$, an epitaxial region near the N-type element isolation regional section has an impurity concentration between these. Temporarily, supposing per μm, a gradient of a profile of this intermediate concentration is a gradient which changes every 1/10, a width of 4 μm is necessary in order that 1e18/cm$^3$ of N-type element isolation region becomes the same as 1e15/cm$^3$ of concentration of the epitaxial region.

That is, in order to make the concentration, which influences the PN junction capacitance expressed in Formula (1), be 1e14 of impurity concentration in the epitaxial region, it is necessary to secure at least 4 μm or more from the first N-type element isolation region to an edge of the depletion layer region. For example, in the case of a line sensor with a resolution of 2400 dpi, since a pixel pitch becomes about 10.5 μm, when a distance of 4 μm of one side from the first N-type element isolation region to the edge of the depletion layer region, that is, a distance of a total of 8 μm is provided, it is extremely difficult to secure a depletion layer region width and a P-type element isolation region width. Then, supposing the second N-type element isolation region whose impurity concentration is low is the impurity concentration of 1e16, a distance from the second N-type element isolation region to the edge of the depletion layer region may be 2 μm or more.

For this reason, the structure of using the first N-type element isolation region 103 and second N-type element isolation region 104 whose concentrations are different functions particularly effectively. In addition, since it is possible to suppress divergence of the second N-type element isolation region in the lateral direction so long as the second N-type element isolation region 104 is formed after the thermal diffusion process of the first N-type element isolation region 103 as shown in this manufacturing process, a high advantageous effect is obtained.

What is necessary is just to select a concentration distribution of the second N-type element isolation region in a depth direction so that the depletion layer region 106 may be formed optimally.

In addition, it is also possible not to perform ion implantation but to form the second element isolation region 104 by diffusion from the first element isolation region 103. When the second element isolation region formed in this way is used, the same advantageous effect as that of this embodiment is obtained.

Second Embodiment

Figure 5:
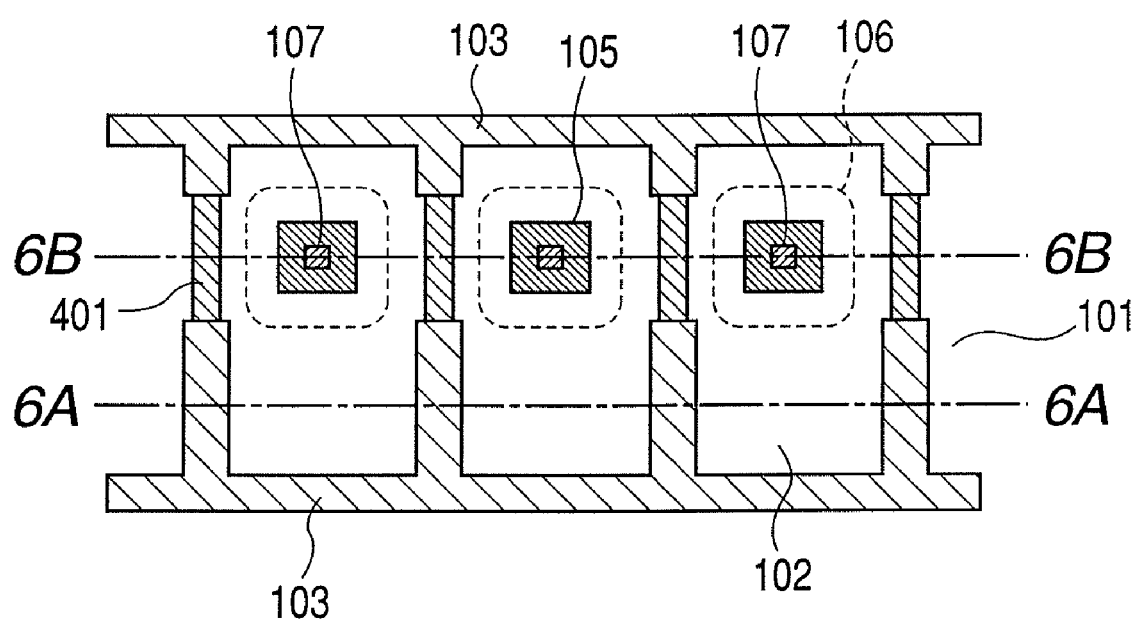
FIG. 5 is a plan showing structure of a second embodiment including three pixels.
Figure 6A:
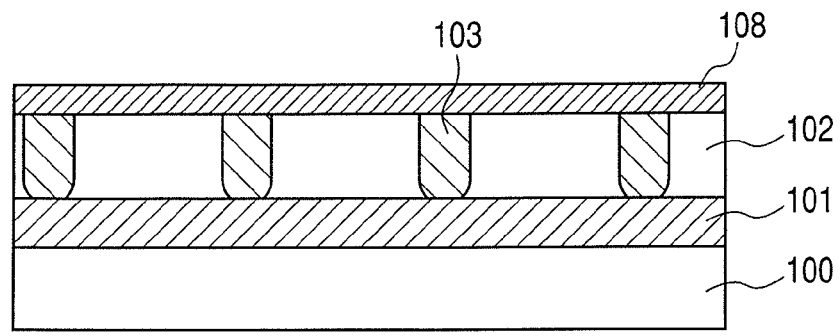
FIG. 6A is a schematic diagram of section structure of an 6A-6A section in FIG. 5.
Figure 6B:
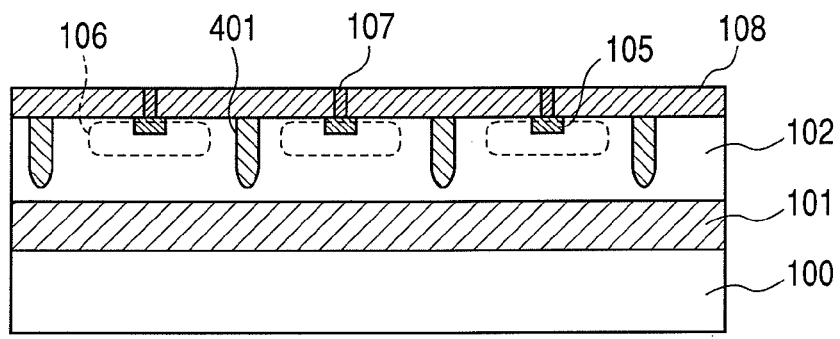
FIG. 6B is a schematic diagram of section structure of a 6B-6B section in FIG. 5.

FIG. 5 is a plan showing structure of including three pixels in a second embodiment. Similarly to FIG. 1, FIG. 5 shows the photoelectric conversion section shown in FIG. 12 with focusing it. FIG. 6A is a schematic diagram of section structure in an 6A-6A section in FIG. 5, and FIG. 6B is a schematic diagram of section structure in a 6B-6B section in FIG. 5. In addition, in FIGS. 5 and 6, the same reference characters are assigned to the same parts as those in FIGS. 1, 2A and 2B. In regard to structure in FIGS. 5, 6A and 6B, descriptions of the same components as those in the first embodiment are omitted, and a readout circuit is not shown.

In FIGS. 5, 6A and 6B, the third N-type element isolation region 401 has a width of an element isolation region narrower than that of the first N-type element isolation region 103. This structure can be simultaneously formed by controlling the width of a shape of the ion implantation region specified in the photolithography process, for example, in the process of forming the first N-type element isolation region 103 described previously. In this embodiment, it is made that the impurity concentration of the third N-type element isolation region is the same as that of the first N-type element isolation region.

Although the depletion layer was extended toward the epitaxial layer by a reverse bias between the P-type region 105 and epitaxial region 102, a width of a third N-type pixel region 401 was designed lest the depletion layer should arrive at the third N-type element isolation region 401. Even if an impurity concentration of the third N-type pixel isolation region 401 is higher than that of the first N-type element isolation region, it is good so long as the depletion layer does not arrive at the third N-type element isolation region 401. Of course, the impurity concentration of the third N-type pixel isolation region 401 may be lower than that of the first N-type element isolation region.

In consequence, it was possible to produce the photoelectric conversion device with a small pixel pitch whose sensitivity was high and in which the increase in crosstalk was suppressed.

Third Embodiment

Figure 7:
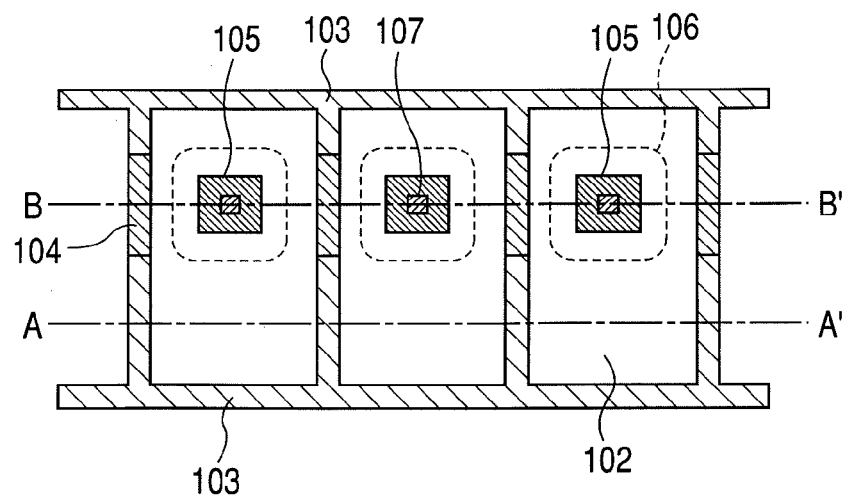
FIG. 7 is a plan of a photoelectric conversion device of a third embodiment.

FIG. 7 is a plan of a photoelectric conversion device of a third embodiment. FIG. 7 is a diagram corresponding to FIG. 1 or FIG. 5, and the same reference numerals are applied to the same parts.

In this embodiment, it is a feature that the second N-type impurity region 104 has a depth of an element isolation region shallower than that of the first N-type element isolation region 103. For example, although the first N-type element isolation region 103 is constructed of two or more layers of impurity regions, the second N-type element isolation region 104 is constructed of one layer of impurity region.

FIGS. 8A to 8H, and FIGS. 9A to 9H are process charts for describing a manufacturing process of the pixel structure in FIG. 7. FIGS. 8A to 8H correspond to the A-A' section in FIG. 7, and FIGS. 9A to 9H correspond to the B-B' section in FIG. 7.

Figure 8A:
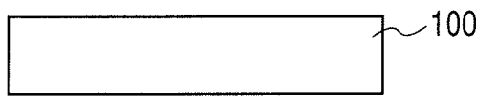
FIGS. 8A, 8B, 8C, 8D, 8E, 8F, 8G and 8H are process charts for showing a semiconductor manufacturing of pixel structure of the third embodiment.
Figure 8B:
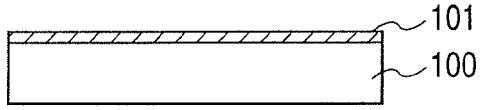
Figure 8C:
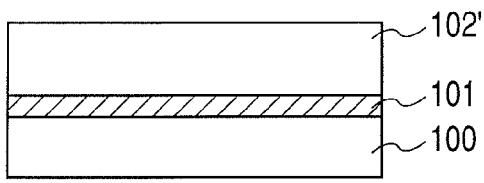
Figure 8D:
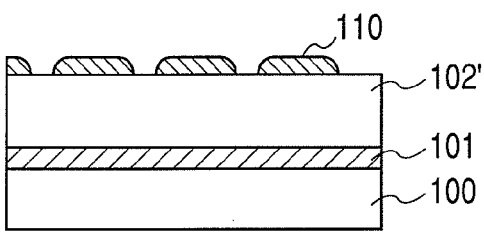
Figure 8E:
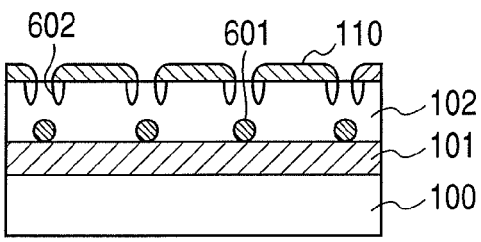
Figure 8F:
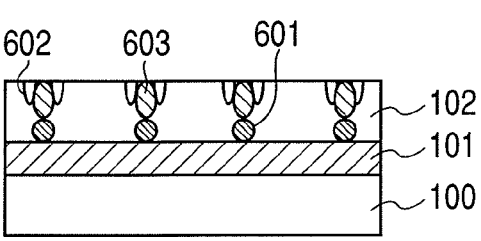
Figure 8G:
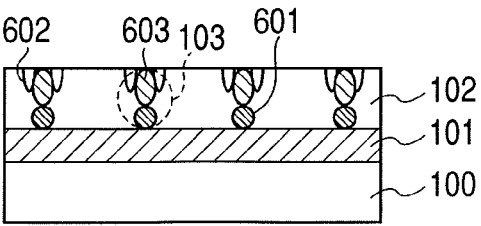
Figure 8H:
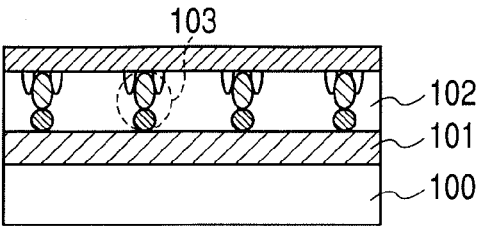
Figure 9A:
FIGS. 9A, 9B, 9C, 9D, 9E, 9F, 9G and 9H are process charts for showing a semiconductor manufacturing of pixel structure of the third embodiment.
Figure 9B:
Figure 9C:
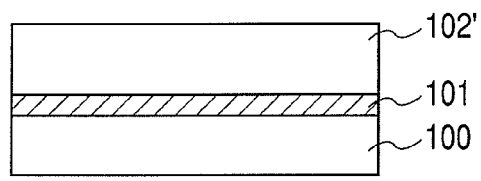
Figure 9D:
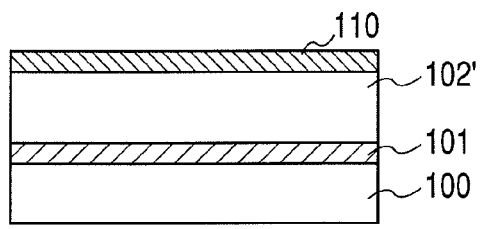
Figure 9E:
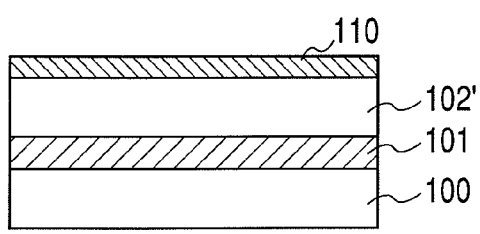
Figure 9F:
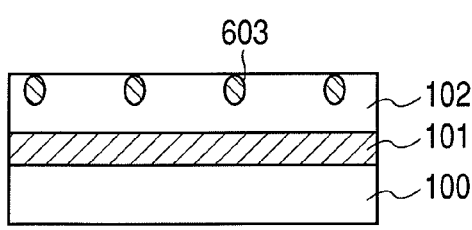
Figure 9G:
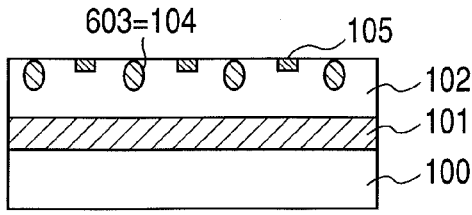
Figure 9H:
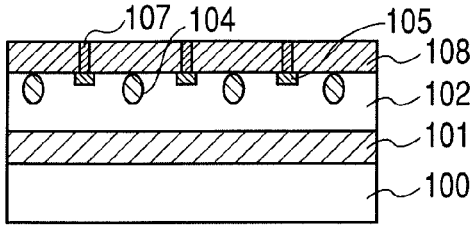

A completed sectional views are FIG. 8H and FIG. 9H, and what show the processes to FIG. 8H and FIG. 9H are FIGS. 8A to 8G, and FIGS. 9A to 9G.

In addition, descriptions of the manufacturing process are performed only about diffusion regions required in order to form this pixel structure, and descriptions of the manufacturing processes of a MOSFET and the like for forming a readout circuit of this photoelectric conversion device are omitted for simplification.

In addition, in FIGS. 8 and 9, the same reference characters are assigned to the same components as those in FIGS. 3 and 4, and their descriptions are omitted.

First, as shown in FIG. 8A and FIG. 9A, the N-type semiconductor substrate 100 is prepared.

Next, as shown in FIG. 8B and FIG. 9B, the N-type buried region 101 is formed on the N-type semiconductor substrate 100 by the ion implantation process.

Subsequently, as shown in FIG. 8C and FIG. 9C, the N-type epitaxial region 102' having an impurity concentration of 1e14 to 1e15/cm$^3$ is formed on the N-type buried layer 101 by the epitaxial growth.

Next, as shown in FIG. 8D and FIG. 9D, it leaves a part and the thick film photoresist 110 for high energy ion implantation is patterned in the photolithography process.

Subsequently, as shown in FIG. 8E and FIG. 9E, an N-type diffusion region 601 is formed in a region specified in the photolithography process by a 500 keV to 2.0 MeV or more high-energy ion implantation process through the above-mentioned thick film resist in the N-type epitaxial region 102. Then, an N-type diffusion region 602 is formed in a thin resist region in the periphery specified by the photolithography process. An impurity concentration of the N-type diffusion region 601 is 1e16/cm$^3$ ($1 \times 10^{16}$/cm$^3$) or more, and an impurity concentration of the N-type diffusion region 602 becomes 1e15 to 1e17/cm$^3$.

Next, as shown in FIG. 8F and FIG. 9F, an N-type diffusion region 603 is formed in a region of the N-type epitaxial region 102, specified in the photolithography process, in an about 50 keV to 200 keV ion implantation process. An impurity concentration of the N-type diffusion region 603 becomes 1e17/cm$^3$ or more. In addition, the N-type diffusion regions 601, 602 and 603 in the A-A' section are connected as N-type diffusion regions to become the first element isolation region 103. The N-type diffusion region 603 in the B-B' section becomes the second element isolation region 104 as it is.

Next, as shown in FIG. 8G and FIG. 9G, the P-type region 105 is formed in a region of the N-type epitaxial region 102, specified in the photolithography process, in the ion implantation process.

Finally, as shown in FIG. 8H and FIG. 9H, the interlayer insulation film 108 and metal electrode 107 are formed.

When the N-type impurity layer 601 which is in a deep position is formed in BB' section, similarly to the A-A' section, an N-type impurity layer is formed in the same depth as the N-type impurity layer 602 also in the B-B' section. This is because ions are implanted into a comparatively shallow position from a silicon surface since a thick resist layer used at the time of the high-energy ion implantation tends to generate "sagging" near an aperture. Divergence of the depletion layer spreading from the P-type signal acquisition region 107 is suppressed by this N-type impurity layer, which becomes a cause of the degrading sensitivity of a photoelectric conversion device by it. Therefore, it is structure suitable for obtaining low cross talk with maintaining high sensitivity not to make the N-type impurity layer, formed in the deep position, near the acquisition electrode.

On the other hand, it is possible to suppress leaking-in of electric charges to an adjacent pixel by making the N-type impurity region into two or more layers in a position distant from the signal acquisition electrode like the B-B' section.

In addition, although it is exemplified that an isolation width widens by 'sagging' arising in a resist shape in this embodiment, beside this, for example, since fine etching of the thick film photoresist for high energy is harder than that of a usual resist, the isolation width cannot but be widen. In addition, in the case of making the isolation width arrive deeply by the thermal diffusion, since the diffusion proceeds not only in a depth direction but also in a lateral direction, the isolation width becomes large.

Thus, generally, when a deep isolation layer is formed since it is easy for the isolation width to become wide in a lateral direction, and when a shallow isolation layer is formed, it is possible to form a narrow isolation width in a lateral direction.

Hence, in this embodiment, by forming the first element isolation region 103 in a position deeper than a position where the second element isolation region 104 is at a peak concentration, it is possible to achieve the photoelectric conversion device which has pixel structure compatible in suppression of degrading sensitivity and reduction of crosstalk.

Although the case of forming the first element isolation region 103 with combining the multiple times of ion implantation where ion implantation energy is changed is described in the above-mentioned embodiments, the first element isolation region 103 may be formed by one ion implantation process. In addition, the ion implantation process of forming the second element isolation region 104 is used also in order to form the first element isolation region 103, but it is also good to form them in separate ion implantations.

Although the case that the P-type region is provided in the N-type region is exemplified in the above-mentioned first to third embodiments, the present invention is not limited to this, but it is possible to obtain the same advantageous effect also in combination of reverse conductivity types.

In addition, although the case of using the low concentration area formed in the photodetector section by the epitaxial growth is exemplified and described in the first to third embodiments, the present invention is not limited to this. For example, even when the element isolation structure mentioned above is formed in the buried region 101 of a silicon substrate by the high-energy ion implantation, the present invention is effective. Then, a silicon substrate may be used for the photodetector section, or it is also good to form the photodetector section by an ion implantation process separately so as to become a suitable impurity concentration.

The line sensor is exemplified and described as the photoelectric conversion device in the first to third embodiments described above. Nevertheless, the present invention is applicable also to a two-dimensional sensor in which a plurality of pixel rows, that is, multiple lines of pixel rows of an R row, a G row, and a B row are arranged on one chip. In the case of the two-dimensional sensor in which multiple lines of pixel rows of an R row, a G row, and a B row are arranged, in each middle pixel row, the second N-type element isolation region (fourth impurity region) is arranged between with adjacent four pixels. Then, in each of both edges of pixel rows, the second N-type element isolation region (fourth impurity region) is arranged between with adjacent three pixels. In addition, it is natural to be able to construct a two-dimensional sensor by arranging three sets of R color, G color, and B color line sensors of this embodiment.

Fourth Embodiment

Figure 10:
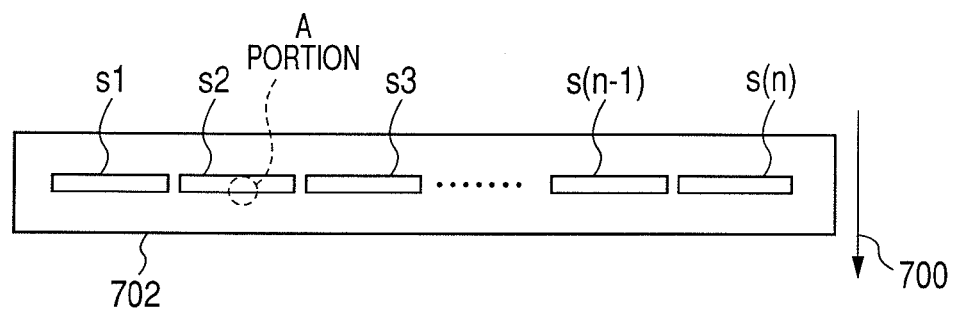
FIG. 10 is a block diagram of a multi-chip image sensor using a photoelectric conversion device.

FIG. 10 is a schematic diagram of a multichip system of semiconductor image sensor in a fourth embodiment in the present invention. A plurality of semiconductor image sensors S1 to S(n) is mounted on a substrate 702 for image sensor mounting, and the photoelectric conversion devices of the first to third embodiments can be used for them. Thus, a multichip system of semiconductor image sensor is constructed by arranging the photoelectric conversion devices of the first to third embodiments along a plurality of columns.

Figure 11:
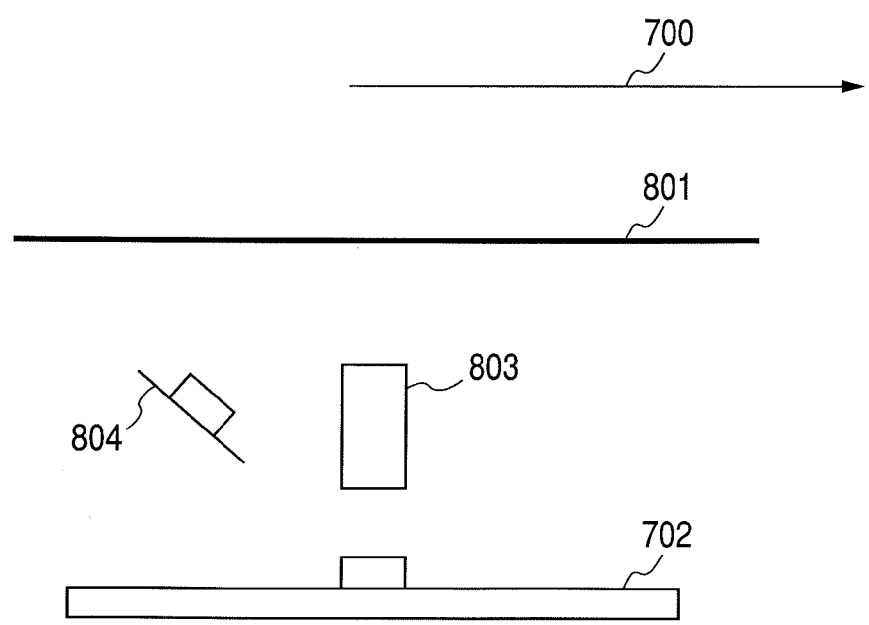
FIG. 11 is a diagram of an optical system of a multi-chip image sensor using a photoelectric conversion device.

FIG. 7 is an enlarged view of an A portion of the multichip system of semiconductor image sensor in FIG. 10. In the enlarged view of the A portion, the same reference symbols are applied to the same components in FIG. 1, and hence, their descriptions are omitted. FIG. 11 is a sectional block diagram showing an optical system using the above-mentioned multichip system of semiconductor image sensor.

FIG. 11 shows an original 801, a SELFOC lens array (trade name, made by Nippon Sheet Glass Co., Ltd.) 803, and an LED array 804 for original illumination. Combination of a light emitting diode and a light guide body is also well used instead of the LED array 804 for original illumination.

An arrow 700 in FIG. 10 and FIG. 11 shows a subscanning direction of the original. A resolution in this subscanning direction is mainly determined by a scan pitch. On the other hand, since a pitch in a main scanning direction is determined by a specification of an image sensor, sensitivity is enhanced by widening an area in the subscanning direction.

In the case of a photoelectric conversion device which operates a photoelectric conversion device mechanically in a line sensor to scan an image, it is frequent that a resolution in a subscanning direction is more important than a resolution in a main scanning direction. For this reason, in this embodiment, as shown in FIG. 7, in order to be compatible in a resolution and sensitivity, each rectangular pixel is formed so that an aspect ratio may be one or more.

In the case of a rectangular pixel whose aspect ratio of the main scanning direction and a subscanning direction in a unit pixel is one or more, by adopting structure of arranging the second N-type element isolation region 104 only in a longer side of a rectangle as shown in this embodiment, it is possible to achieve the multi-chip image sensor having a high resolution and high sensitivity with suppressing an increase in crosstalk to the minimum.

The present invention is applied to a photoelectric conversion device used for a scanner, a video camera, a digital still camera, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-218330, filed Aug. 24, 2007, which is hereby incorporated by reference herein in its entirety.

What is claimed is:

1. A photoelectric conversion device comprising:
a plurality photoelectric conversion regions, each including a first impurity region of a first conductivity type and a second impurity region of a second conductivity type operating as a signal acquisition region arranged in the first impurity region,
a plurality of amplifying transistors for each of the plurality of photoelectric conversion regions, respectively,
a third impurity region of the first conductivity type, and
a fourth impurity region of the first conductivity type, wherein
for at least one of the plurality of photoelectric conversion regions, in a plane parallel to a light receiving surface of the photoelectric conversion region, the first impurity region is surrounded by the third impurity region and the fourth impurity region,
the fourth impurity region is disposed between the second impurity region in the first impurity region surrounded by the third and fourth impurity regions and another second impurity region adjacent the second impurity region, and
an impurity concentration of the fourth impurity region is smaller than an impurity concentration of the third impurity region.

2. The photoelectric conversion device according to claim 1, wherein the fourth impurity region is arranged in a region between two adjacent signal acquisition regions.

3. The photoelectric conversion device according to claim 1, wherein, in the plane parallel to the light receiving surface of the photoelectric conversion region, the second impurity region has a square rectangular shape, such that the fourth impurity region is arranged along a longer side of the second impurity region of the square rectangular shape.

4. The photoelectric conversion device according to claim 1, wherein the photoelectric conversion device is included among a plurality of photoelectric conversion devices arranged in at least one line in an image sensor.

5. The photoelectric conversion device according to claim 1, wherein the second impurity region and a gate electrode of the amplifying transistor are connected by a wire.

6. The photoelectric conversion device according to claim 1, wherein the photoelectric conversion device is one of a plurality of photoelectric conversion devices arranged in a plurality of columns in a multi-chip image sensor.

7. The photoelectric conversion device according to claim 6, wherein the multi-chip image sensor includes a color filter.

8. A photoelectric conversion device comprising:
a plurality photoelectric conversion regions, each including a first impurity region of a first conductivity type and a second impurity region of a second conductivity type operating as a signal acquisition region arranged in the first impurity region,
a plurality of amplifying transistors for each of the plurality of photoelectric conversion regions, respectively,
a third impurity region of the first conductivity type, and
a fourth impurity region of the first conductivity type, wherein
for at least one of the plurality of photoelectric conversion regions, in a plane parallel to a light receiving surface of the photoelectric conversion region, the first impurity region is surrounded by the third impurity region and the fourth impurity region,
the fourth impurity region is disposed between the second impurity region in the first impurity region surrounded by the third and fourth impurity regions and another second impurity region adjacent the second impurity region, and
in the plane parallel to the light receiving surface of the photoelectric conversion region, an isolation width of the fourth impurity region is narrower than an isolation width of the third impurity region.

9. The photoelectric conversion device according to claim 8, wherein the fourth impurity region is arranged in a region between two adjacent signal acquisition regions.

10. The photoelectric conversion device according to claim 8, wherein, in the plane parallel to the light receiving surface of the photoelectric conversion region, the second impurity region has a square rectangular shape, such that the fourth impurity region is arranged along a longer side of the second impurity region of the square rectangular shape.

11. The photoelectric conversion device according to claim 8, wherein the photoelectric conversion device is included among a plurality of photoelectric conversion devices arranged in at least one line in an image sensor.

12. The photoelectric conversion device according to claim 8, wherein the second impurity region and a gate electrode of the amplifying transistor are connected by a wire.

13. The photoelectric conversion device according to claim 8, wherein the photoelectric conversion device is one of a plurality of photoelectric conversion devices arranged in a plurality of columns in a multi-chip image sensor.

14. The photoelectric conversion device according to claim 13, wherein the multi-chip image sensor includes a color filter.

15. A photoelectric conversion device comprising:
a plurality of photoelectric conversion regions, each including a first impurity region of a first conductivity type and a second impurity region of a second conductivity type operating as a signal acquisition region arranged in the first impurity region,
a plurality of amplifying transistors for each of the plurality of photoelectric conversion regions, respectively,
a third impurity region of the first conductivity type, and
a fourth impurity region of the first conductivity type, wherein
for at least one of the plurality of photoelectric conversion regions, in a plane parallel to a light receiving surface of the photoelectric conversion region, the first impurity region is surrounded by the third impurity region and the fourth impurity region,
the fourth impurity region is disposed between the second impurity region in the first impurity region surrounded by the third and fourth impurity regions and another second impurity region adjacent the second impurity region, and
a depth of the fourth impurity region from the plane including the light receiving surface of the photoelectric conversion region is smaller than a depth of the third impurity region from the plane including the light receiving surface of the photoelectric conversion region.

16. The photoelectric conversion device according to claim 15, wherein the fourth impurity region is arranged in a region between two adjacent signal acquisition regions.

17. The photoelectric conversion device according to claim 15, wherein in the plane parallel to the light receiving surface of the photoelectric conversion region, the second impurity region has a square rectangular shape, such that the fourth impurity region is arranged along a longer side of the region of the square rectangular shape.

18. The photoelectric conversion device according to claim 15, wherein the photoelectric conversion device is included among a plurality of photoelectric conversion devices arranged in at least one line in an image sensor.

19. The photoelectric conversion device according to claim 15, wherein the second impurity region and a gate electrode of the amplifying transistor are connected by a wire.

20. The photoelectric conversion device according to claim 15, wherein the photoelectric conversion device is one of a plurality of photoelectric conversion devices arranged in a plurality of columns in a multi-chip image sensor.

21. The photoelectric conversion device according to claim 20, wherein the multi-chip image sensor includes a color filter.

* * * * *